· US011757351B2

United States Patent
Balaji et al.

(10) Patent No.: US 11,757,351 B2
(45) Date of Patent: Sep. 12, 2023

(54) DYNAMIC OVERCURRENT LIMIT THRESHOLD FOR A VOLTAGE REGULATOR

(71) Applicant: Texas Instruments Incorporated, Dallas, TX (US)

(72) Inventors: Ammineni Balaji, Pradesh (IN); Preetam Charan Anand Tadeparthy, Yelankha (IN); Naman Bafna, Madhya Pradesh (IN); Sreelakshmi Suresh, Bangalore (IN); Cheng Wei Chen, Manchester, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 115 days.

(21) Appl. No.: 17/390,539

(22) Filed: Jul. 30, 2021

(65) Prior Publication Data
US 2023/0035151 A1    Feb. 2, 2023

(51) Int. Cl.
*H02M 1/32*    (2007.01)
*H03K 5/24*    (2006.01)
*H02M 3/155*    (2006.01)

(52) U.S. Cl.
CPC ............. *H02M 1/32* (2013.01); *H02M 3/155* (2013.01); *H03K 5/24* (2013.01)

(58) Field of Classification Search
CPC .............................. H02M 1/32; H02M 3/155
See application file for complete search history.

(56) References Cited

U.S. PATENT DOCUMENTS

| 7,522,398 B2 | 4/2009 | Tang |
| 7,880,455 B2 | 2/2011 | Wu |
| 9,054,525 B2 | 6/2015 | Robinson et al. |
| 9,379,623 B2 | 6/2016 | Zhang et al. |
| 9,515,556 B2 | 12/2016 | Yang et al. |
| 10,171,071 B2 | 1/2019 | Ratz |

(Continued)

OTHER PUBLICATIONS

Notification of Transmittal of the International Search Report and the Written Opinion of the International Searching Authority, or the Declaration; International application No. PCTUS2022/039006; dated Nov. 28, 2022, 11 pages.

*Primary Examiner* — Kyle J Moody
*Assistant Examiner* — Jye-June Lee
(74) *Attorney, Agent, or Firm* — Ray A. King; Frank D. Cimino (57) ABSTRACT

Described embodiments include a voltage regulator circuit comprising a first comparator having a first comparator input coupled to a waveform input source, a second comparator input coupled to an output voltage terminal and a first comparator output. There is a second comparator having third and fourth comparator inputs and a second comparator output, the third comparator input coupled to a voltage source configured to provide a voltage representing a current limit, and the fourth comparator input coupled to the output voltage terminal. There is also a state machine having a first state machine input coupled to the first comparator output, a second state machine input coupled to the second comparator output and a state machine output, wherein a state of the state machine is determined by the first and second comparator outputs, and the state machine output provides a PWM signal responsive to the state of the state machine.

20 Claims, 5 Drawing Sheets

(56) References Cited

U.S. PATENT DOCUMENTS

| | | | |
|---|---|---|---|
| 10,193,451 B2 | 1/2019 | Luo et al. | |
| 10,224,821 B2 | 3/2019 | Zhang et al. | |
| 10,243,465 B1* | 3/2019 | Young | H02M 1/32 |
| 2014/0253083 A1* | 9/2014 | Shao | H02M 1/32 |
| | | | 323/285 |
| 2015/0280544 A1 | 10/2015 | Wang et al. | |
| 2017/0194858 A1 | 7/2017 | Villot et al. | |
| 2017/0201086 A1 | 7/2017 | Chen et al. | |
| 2017/0373602 A1* | 12/2017 | Lian | H02M 3/338 |
| 2018/0026537 A1* | 1/2018 | Vicquery | H02M 1/32 |
| | | | 323/271 |
| 2021/0006158 A1* | 1/2021 | Neyra | H02M 1/32 |
| 2021/0021119 A1 | 1/2021 | Yang | |
| 2022/0209658 A1* | 6/2022 | Bafna | H02M 1/32 |
| 2022/0393588 A1* | 12/2022 | Bafna | H02M 3/157 |

\* cited by examiner

DYNAMIC OVERCURRENT LIMIT THRESHOLD FOR A VOLTAGE REGULATOR

BACKGROUND

This description relates to voltage regulators having an overcurrent limit, including buck regulators, boost regulators and buck/boost regulators.

A voltage regulator is an electronic circuit that regulates a voltage from its input (e.g., system power rail) to its output (e.g., integrated circuits). Voltage regulators may be implemented as a switching regulator, such as a buck converter, a boost converter, or a buck/boost converter. Multiphase buck regulators are sometimes used in computer processors and wired networks to power the central processing units (CPUs) and their peripherals.

A voltage regulator is expected to maintain its output voltage within a specified tolerance band across all frequencies and switching load transients. Multiphase regulators can be found on computer motherboards for laptops, tablets, servers and Ethernet switches. In many computer systems, a voltage regulator on the motherboard may have three or more phases. A multi-phase voltage regulator uses multiple circuits connected in parallel, with each phase providing a portion of the total current that is required from the regulator.

SUMMARY

The first described embodiment presents a voltage regulator circuit comprising a first comparator having a first comparator input coupled to a waveform input source, a second comparator input coupled to an output voltage terminal and a first comparator output. There is a second comparator having third and fourth comparator inputs and a second comparator output, the third comparator input coupled to a voltage source configured to provide a voltage representing a current limit, and the fourth comparator input coupled to the output voltage terminal. There is also a state machine having a first state machine input coupled to the first comparator output, a second state machine input coupled to the second comparator output and a state machine output, wherein a state of the state machine is determined by the first and second comparator outputs, and the state machine output provides a pulse-width-modulated (PWM) signal responsive to the state of the state machine.

A second example embodiment presents a method of improving transient response in a voltage regulator comprising setting an overcurrent limit for the voltage regulator to a first value and operating the voltage regulator in a normal operating state, wherein the first value being higher than a continuous current limit value for the voltage regulator. Next, the output current being provided by the voltage regulator is measured. The method includes detecting whether the voltage regulator has transitioned from the normal operating state to an overcurrent state, decreasing the overcurrent limit to a second value in response to detecting a transition to the overcurrent state, the second value being equal to the continuous current limit for the voltage regulator, then reducing a load demand on the voltage regulator to cause the measured output current to be lower than the second value, Finally, the method includes increasing the overcurrent limit back to the first value in response to the voltage regulator transitioning from the overcurrent state to the normal operating state.

A third example embodiment presents a voltage regulator system comprising an inductor coupled to an output voltage terminal, a current sense circuit having a current sense input and a current sense output, the current sense input coupled to the inductor, a first comparator having first and second comparator inputs and a first comparator output, the first comparator input coupled to a waveform input source, and the second comparator input coupled to the output voltage terminal, a second comparator having third and fourth comparator inputs and a second comparator output, the third comparator input coupled to a voltage source configured to provide a voltage representing a current limit, and the fourth comparator input coupled to the current sense output.

There is also a state machine having first and second state machine inputs and a state machine output, the first state machine input coupled to the first comparator output, the second state machine input coupled to the second comparator output, and a driver circuit having a driver input and a driver output, the driver input coupled to the state machine output, wherein a state of the state machine is determined in response to the first and second comparator outputs, and the state machine output provides a PWM signal responsive to the state of the state machine.

DETAILED DESCRIPTION

In this description, the same reference numbers depict the same or similar (by function and/or structure) features. The drawings are not necessarily drawn to scale.

Figure 1:
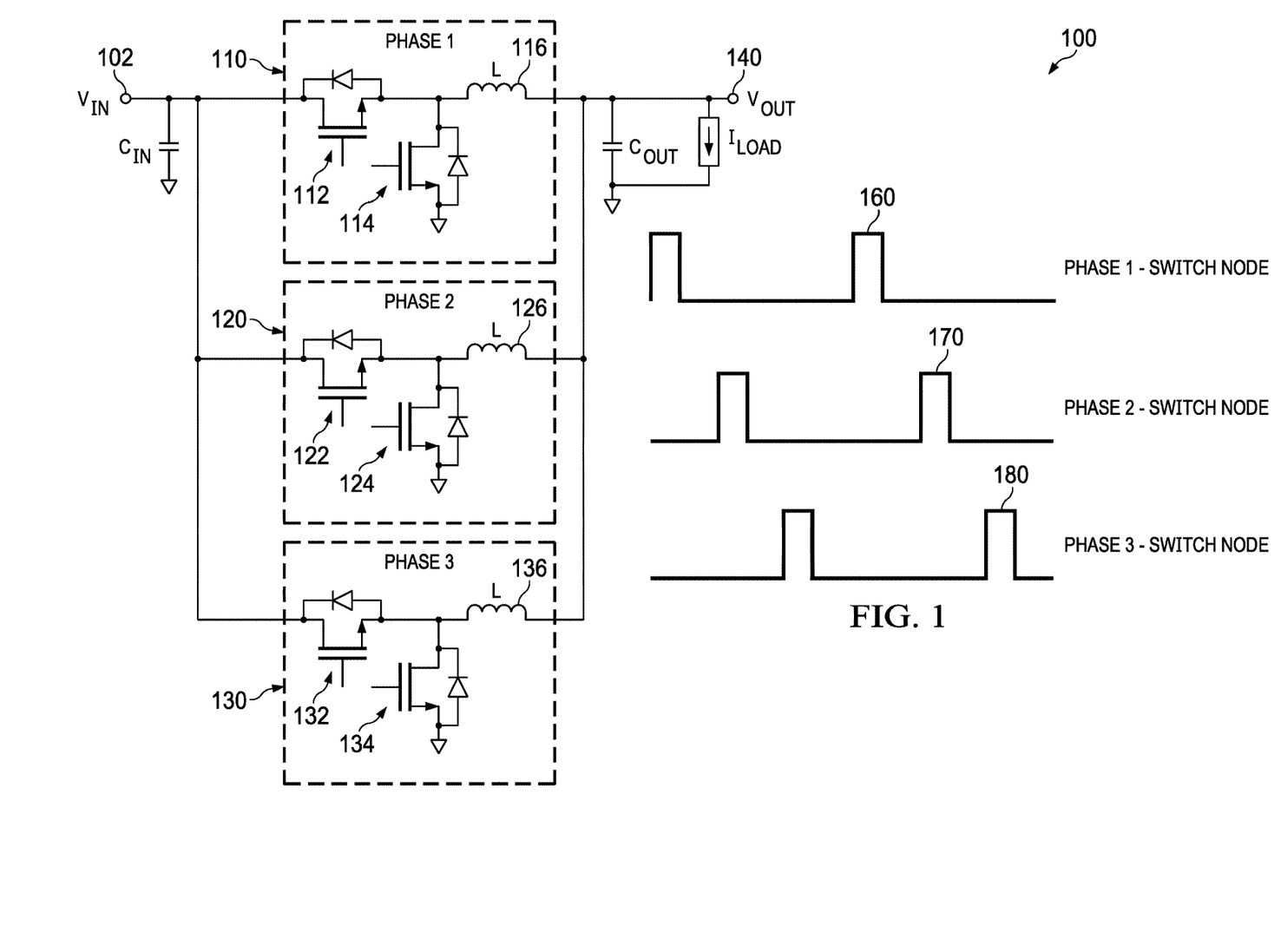
FIG. 1 shows the operation of a typical multi-phase voltage regulator.

FIG. 1 shows the operation of a typical multi-phase voltage regulator 100. Voltage regulator 100 is a three-phase regulator. Phase 1 110 has an inductor 116 and a pair of power field effect transistors (FETs) 112 and 114. Similarly, phase 2 120 has an inductor 126 and a pair of power FETs 122 and 124. Likewise, phase 3 130 has an inductor 136 and a pair of power FETs 132 and 134. The FETs of each phase 110, 120 and 130 are configured as an H-bridge with the source terminal of the top FET of each phase connected to input supply voltage terminal $V_{IN}$ 102, and the drain terminal of the bottom FET of each phase connected to ground. The remaining current terminals of each FET in the FET pair are connected together and connected to a first terminal of their respective inductor, 116 for phase 1, 126 for phase 2 and 136 for phase 3. The second terminals of each inductor 116, 126 and 136 are connected to the output voltage terminal $V_{OUT}$ 140. The regulated output voltage terminal $V_{OUT}$ 140 supplies a current LOAD to the load. Other voltage regulator examples may have more or less than three phases. The power transistors are shown as FETs, but any other suitable solid-state transistor devices (e.g., such as bipolar junction transistors (BJTs)) can be used in place of the FETs.

The three phases are connected in parallel and share an input filter capacitor $C_{IN}$ and an output filter capacitor $C_{OUT}$. During steady-state operation, the individual phases are active during spaced phase intervals equal to 360°/n throughout the switching period, where n is the total number of phases. Diagrams 160, 170 and 180 illustrate the relative timing of the drive signals from phase 1 110, phase 2 120 and phase 3 130.

Figure 2:
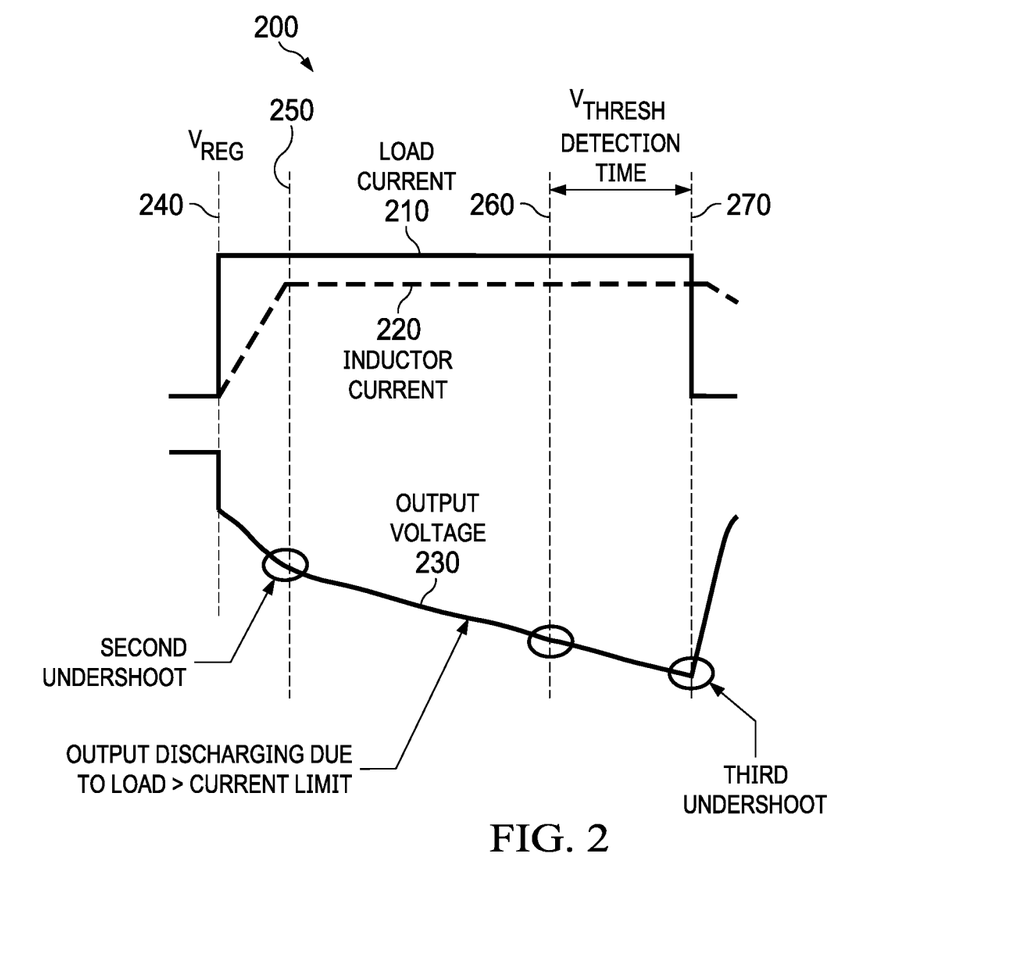
FIG. 2 shows voltage and current curves for the output of an example voltage regulator operating in an overcurrent limit condition.

FIG. 2 shows voltage and current curves for the output of an example voltage regulator operating in an overcurrent limit condition. Graph 210 shows the load current demand being requested by the system processor. Initially, the current demand is minimal or near zero. At time 240, the current demand 210 increases stepwise to a current level that is higher than what the voltage regulator can provide at its output. Graph 220 shows the actual current delivered at the output of the voltage regulator. When the current demand 210 increases stepwise at time 240, the current delivered 220 begins to ramp up until time 250, at which time the voltage regulator reaches the maximum current the voltage regulator can supply, and the current delivered 220 levels off. The current delivered 220 then remains at its maximum level until the current demand 210 drops at time 270.

Graph 230 shows the voltage at the output of the voltage regulator. Initially, the voltage is at its nominal regulated output voltage $V_{reg}$. At time 240, the current demand 210 increases stepwise to a level that is higher than what the voltage regulator can provide to the load. The voltage regulator will attempt to make up the deficit in current by draining stored electrical charge from the output capacitor. However, draining electrical charge from the output capacitor causes the regulator output voltage to begin dropping, resulting in a voltage undershoot. A first undershoot in the output voltage 230 occurs at time 240 as the load current demand increases.

The undershoot in the output voltage 230 continues to increase for as long as the current delivered 220 remains lower than the current demanded 210. The rate of increase in the voltage undershoot decreases as the current delivered 220 increases. At time 260, the processor detects that the output voltage 230 has dropped below a threshold due to the current demand exceeding the current-delivering capability of the voltage regulator. At time 270, realizing that the power supply is in current limit, the processor releases the load and the current demand drops to near zero. However, there is a delay between the time 260 that the output voltage drops below the threshold voltage and the time the processor drops the load. Once the current demand 240 falls to within the ability of the voltage regulator to supply current, the output voltage 230 begins to rise and return to its nominal regulated voltage.

To prolong the life of the power FETs in a switching power supply and improve their reliability, it is desirable to set a maximum current limit for the voltage regulator output. For multiphase voltage regulators, the power supply current limit is the number of phases in the voltage regulator multiplied by the current limit per phase. In some example systems, operating in an overcurrent limit condition is considered to be an invalid operating condition, and the system processor will reduce the current demand by shutting down circuits until the current demand falls to within the ability of the voltage regulator to supply current.

However, in other systems, the system processor may be allowed to demand a higher current than the voltage regulator current limit for a short period of time (e.g. less than ten microseconds). Following this short period, the current demand is then reduced to a level below the voltage regulator current limit. In this case, circuit designers may be forced to choose between either having poor transient performance on the voltage regulator output voltage or degraded reliability of the power FETs in the voltage regulator output stage. Power FETs may be able to sustain peak currents higher than their continuous current rating, but only for a short time.

Figure 3:
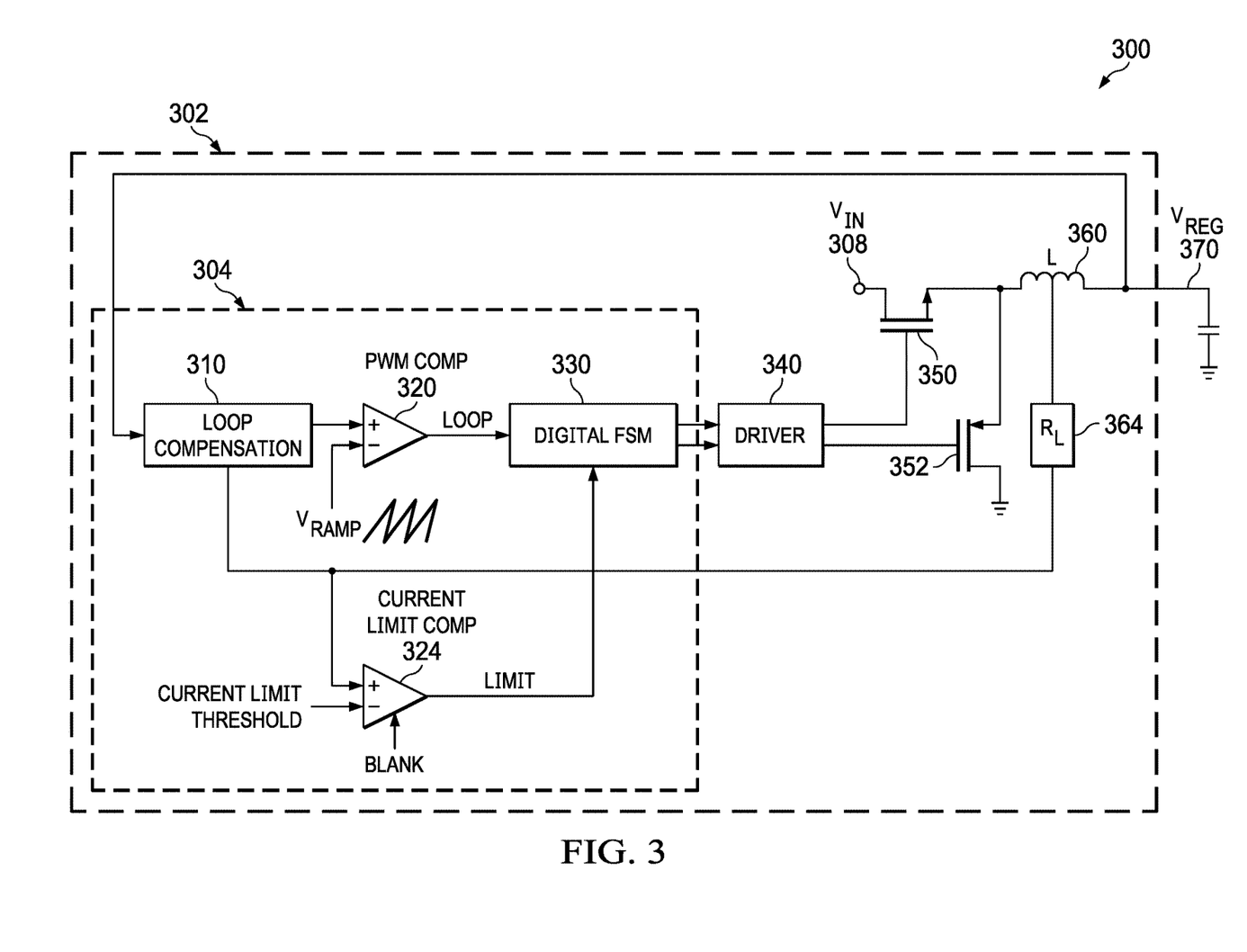
FIG. 3 shows a block diagram of an example valley mode constant on-time buck regulator with current limit.

FIG. 3 shows a block diagram of an example system 300 of a valley mode constant on-time buck regulator with current limit. System 300 includes a switched-mode voltage regulator 302 that includes a controller 304 and power FETs 350 and 352. In some examples, the voltage regulator 302 is a buck voltage regulator. In other examples, the voltage regulator 302 is a buck-boost power converter that is capable of operating according to a buck mode of operation, a boost mode of operation, or a buck-boost mode of operation. In other examples, the voltage regulator 302 is a boost voltage regulator.

This description of system 300 is shown and described as implementing valley mode constant on-time control over the voltage regulator 302. However, other power supply control methods are possible, such as peak current mode control, average current mode control, voltage mode control, or any other suitable form of control implemented in a fixed frequency method, variable frequency method or constant time method (e.g., constant Ton or constant Toff).

The input to voltage regulator 302 is $V_{in}$ 308, and the output of voltage regulator 302 is $V_{reg}$ 370. The output voltage $V_{reg}$ 370 is provided to a load (not shown). The controller 304 includes a pulse-width-modulator (PWM) comparator 320, a current limit comparator 324, and a state machine 330. In some examples, state machine 330 is a digital finite state machine. Power supply 302 further includes a driver 340 and a current sense element 364.

The output voltage terminal $V_{reg}$ 370 is coupled to a first input of the loop compensation 310. In at least one example, loop compensation 310 is implemented as a proportional-integral-derivative (PID) controller. A second input of the loop compensation 310 is the output of current sense element 364. Current sense element 364 measures the current through inductor 360. The circuitry for current sense element 364 may be different for different voltage regulators. Some may use an external resistor for sensing current, while others may have an internal current sense resistor.

The PWM comparator 320 has a first input terminal coupled to the output of the loop compensator 310, and a second input terminal coupled to a terminal providing a ramp input voltage, Vramp. In other examples, the ramp input voltage source provides a sawtooth waveform, a triangle waveform or a sinusoidal waveform. The output terminal of the PWM comparator 320 is coupled to a first input of the state machine 330. In some examples, the first input of the PWM comparator 320 is coupled directly to the output voltage terminal 370.

The current limit comparator 324 has a first input terminal coupled to the current sense element 364, and a second input terminal coupled to a terminal providing a current limit threshold signal. The output terminal of the current limit comparator 324 is coupled to a second input of the state machine 330. In some examples, the current limit comparator 324 may have a control input configured to receive a signal, BLANK, for gating the current limit comparator. In at least one example, the BLANK signal is provided by the state machine 330.

When the BLANK signal is asserted, the current limit comparator 324 may be prevented from providing an asserted value for LIMIT, regardless of the values of the sensed current of the energy storage element of the voltage regulator or the current limit threshold. By modifying the amount of time for which BLANK is asserted, the output of current limit comparator 324 may be disabled for the programmed time of BLANK, without regard to a minimum on time of the voltage regulator. The programmed time may be based on a switching frequency of the voltage regulator, thereby increasing the accuracy of current limit control of the voltage regulator, such as by increasing noise immunity of control of the voltage regulator. In some examples, assertion of BLANK may further take into consideration other circuit conditions. For example, the decision whether to assert BLANK may be at least partially determined according to a sensor output signal, various programmed circuit protection or operation schemes, etc. The BLANK signal drives the output of the current limit comparator 324 to a defined known state for a short time period after the system processor has acquired the required information.

The state machine 330 has an output terminal coupled to an input terminal of the driver 340. Driver 340 has output terminals coupled to the control terminals of FETs 350 and 352 that enable and disable FETs 350 and 352. In some cases, control terminal 350 receives the same signal as control terminal 352. However, in most cases, the output of driver 340 is two separate lines with two separate signals, one coupled to the control terminal of FET 350 and the other coupled to the control terminal of FET 352. Having separate lines to the control terminals of FETs 350 and 352 allows insertion of a dead-time between the disabling and enabling of high-side FET 350 and low-side FET 352.

High-side FET 350 has a first current terminal configured to receive $V_{in}$, and a second current terminal coupled to a first terminal of inductor 360. Low-side FET 352 has a control terminal coupled to an output of driver 340, a first current terminal coupled to ground, and a second current terminal coupled to the first terminal of inductor 360. The second terminal of inductor 360 is coupled to the output voltage terminal $V_{reg}$ 370 and to current sense element 364. In some cases, a capacitor may be coupled between the output voltage terminal 370 and ground.

The output of the PWM comparator 320, LOOP, is active when the voltage control loop is demanding current. The output of the current limit comparator 324, LIMIT, indicates whether the inductor current is lower than the overcurrent limit (OCL) threshold. When the LOOP signal triggers (active), it indicates that the control loop is demanding current and requesting that the state machine 330 enable the PWM generator. The PWM generator will only be enabled when both the LOOP and LIMIT signals are asserted active. Therefore, two conditions must be met before the PWM generator will be enabled. The first condition for enabling the PWM generator is that the system processor be demanding current, and the second condition is that the current through inductor 360 must be lower than the overcurrent limit threshold.

These two signals, LOOP and LIMIT, are inputs to the digital finite state machine (FSM) 330. The FSM 330 checks for active signals on LOOP and LIMIT, then enables the PWM generator at the output of the FSM 330. The PWM generator provides a PWM signal to the driver 340, which provides drive signals to the control terminals of FETs 350 and 352. When FET 350 is in a conductive state (e.g. turned on), the inductor 360 is shorted to $V_{in}$ 308, and there is no connection between inductor 360 and ground because FET 352 is in a non-conductive state (e.g. turned off). When FET 352 is turned on and FET 350 is turned off, inductor 360 is shorted to ground, and there is no connection between inductor 360 and $V_{in}$ 308.

The output of the FSM 330 is determined by which state the state machine is in. In at least one example, FSM 330 has two states: a normal operating state and a overcurrent limit state. The two comparator outputs, LOOP and LIMIT, determine which state FSM 330 goes to. In this manner, the two comparator outputs, LOOP and LIMIT, indirectly determine when FETs 350 and 352 are turned on and turned off.

Figure 4:
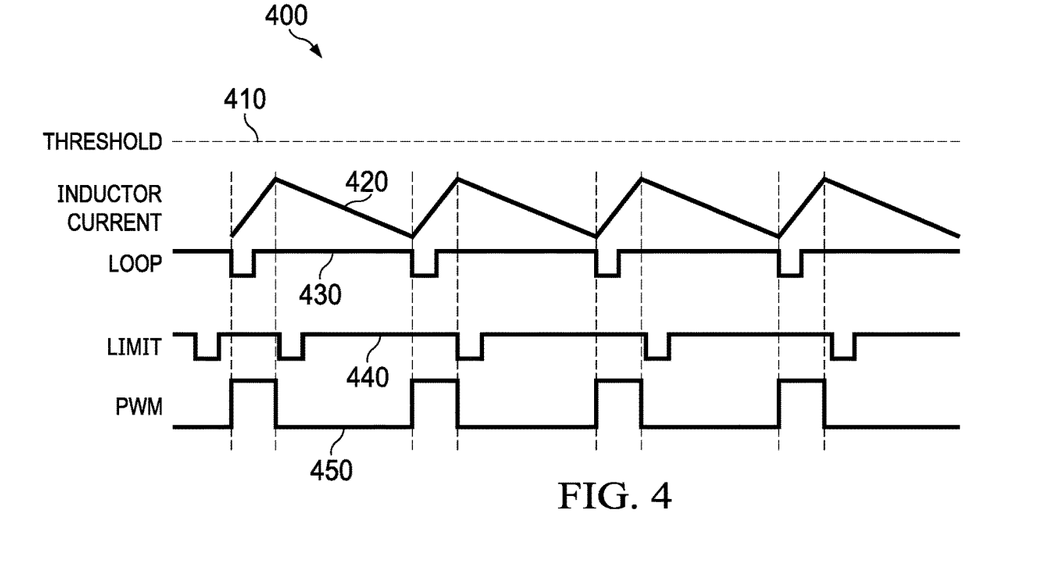
FIG. 4 shows an example signal diagram for normal operation of a valley mode constant on-time buck regulator with no overcurrent limit condition.

FIG. 4 shows an example signal diagram 400 for normal operation of a valley mode constant on-time buck regulator with no overcurrent limit condition. The threshold line 410 represents the overcurrent limit, which is set based on the safe operating current limit of the power FETs. The overcurrent protection shown in 400 is a valley mode protection, but other types of overcurrent protection may be used instead. The peak-to-peak magnitude of the inductor current ripples can be determined based on the switching frequency, inductance value, and the voltages at $V_{in}$ and $V_{reg}$. The overcurrent limit threshold can then be set to ensure that the peak current does not exceed the max current rating.

The inductor current 420 is the current through the inductor 360, which may be measured using the current sense element 364. PWM 450 is the input signal to the driver 340. LOOP 430 is the output of the PWM comparator 320. LIMIT is the output of the current limit comparator 324. LOOP and LIMIT are the inputs to the FSM 330 and are both shown as active low in this example. In other examples, LOOP and LIMIT may be active high.

A low pulse on the LIMIT signal 440 and a low pulse on the LOOP signal 430 each occur during every cycle. During normal operation when the system is not in a current limit condition, a low pulse on the LIMIT signal 440 occurs first, then a low pulse on the LOOP signal 430 follows a set time later. When the circuit is in a non-OCL condition, the low pulse on LIMIT 440 always comes before the low pulse on the LOOP signal 430 because the current through the inductor is lower than the overcurrent limit threshold.

In this condition, when a low pulse on LOOP 430 occurs, the PWM signal 450 is enabled, and the inductor current 420 begins ramping up. As long as the inductor current 420 is lower than the current limit threshold 410, the PWM 450 will be enabled by the state machine 330 when a low pulse occurs from the LOOP signal 430. After a set period, the PWM signal is then disabled, causing the current through the inductor to begin ramping down. This cycle continues to repeat in the same manner as long as the regulator is not in an OCL condition.

Figure 5:
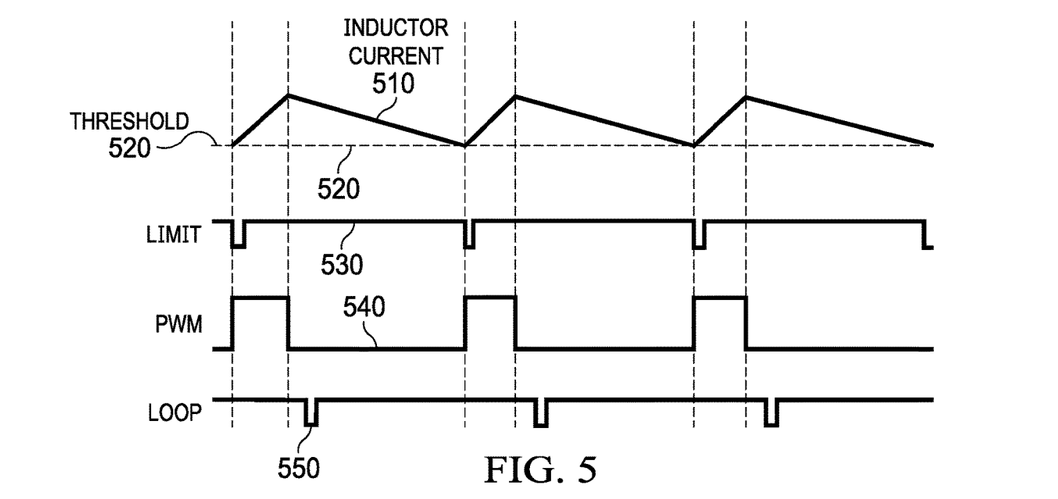
FIG. 5 shows an example signal diagram of operation of a valley mode constant on-time buck regulator during an overcurrent limit condition.

FIG. 5 shows an example signal diagram 500 of operation of a valley mode constant on-time buck regulator during an overcurrent limit condition. When in an OCL condition, the processor is requesting a larger amount of current than the voltage regulator's current limit. Therefore, the voltage control loop begins to demand more current, and more frequent low pulses occur on the LOOP signal 550. A low pulse occurs on the LOOP signal 550 before a low pulse on the LIMIT signal 530 when in an OCL condition. The PWM signal 540 is not immediately enabled with a low pulse on the LOOP signal 550 because a corresponding low pulse on the LIMIT signal 530 has not yet occurred.

When a low pulse on the LIMIT signal 530 occurs, the PWM signal 540 is enabled and the inductor current 510 begins to ramp up. Following a set time period, the PWM signal 540 goes low (inactive) and the inductor current 510 begins to ramp down. When the inductor current reaches the current limit threshold 520, the LIMIT signal 530 pulses low, and the PWM signal 540 goes high (active). In an OCL condition, it is a low pulse on the LIMIT signal that triggers the PWM signal because the condition that a low pulse occur on the LOOP signal will have already been met.

Figure 6:
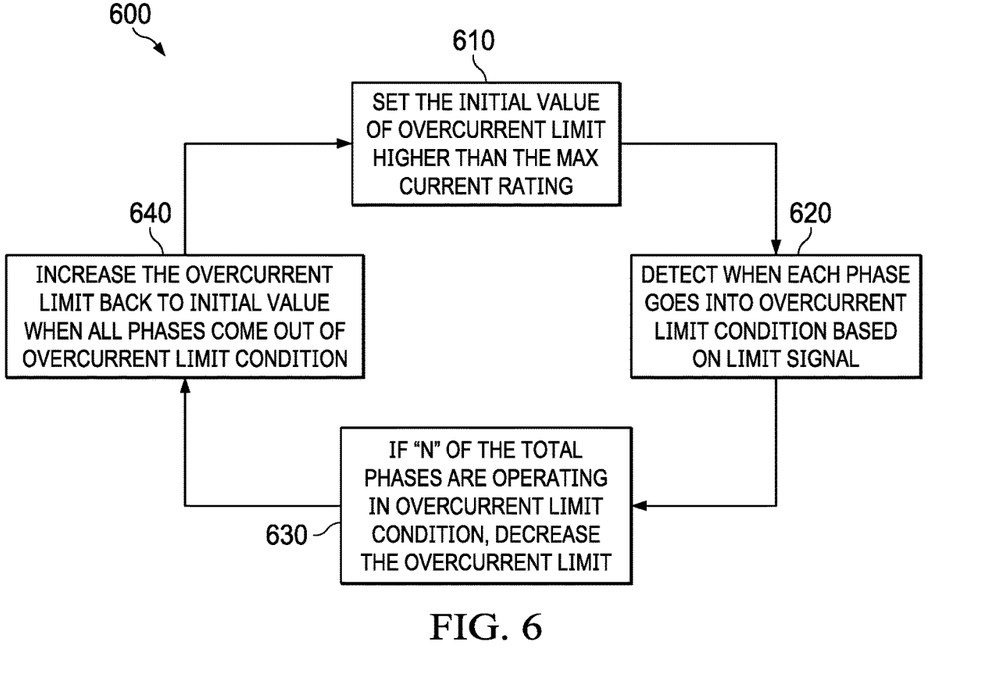
FIG. 6 shows a method for preserving the reliability of the output FETs while maintaining acceptable regulated output voltage transient performance.

Previously, in many cases, circuit designers had to choose between either accepting poor transient performance on the power converter output voltage or having degraded reliability in the power converter output power FETs due to excessive current through the FETs. FIG. 6 illustrates a method 600 for preserving the reliability of the output FETs while maintaining acceptable regulated output voltage transient performance.

The method 600 includes initially setting an overcurrent limit threshold that is above the continuous current rating of the FETs, then dynamically resetting the overcurrent limit threshold in response to detection that the regulator has transitioned from a normal operating state to an OCL state. Power FETs may be able to sustain peak currents that are higher than their continuous current rating without compromising their reliability, but only for a brief period of time (e.g. less than 10 microseconds).

In step 610, the overcurrent limit threshold is set to an initial value. The initial value of the overcurrent limit threshold is higher than the default value for the current limit. For example, if the rated current limit for the system is 40 A, the overcurrent limit threshold may be set to 46 A. This higher overcurrent limit threshold is only maintained as long as the voltage regulator is operating normally and is not in an OCL condition. If the system processor requests an amount of current larger than the initial overcurrent limit threshold, an OCL condition will be created.

In step 620, the LIMIT signal is monitored to detect whether the voltage regulator has transitioned from a normal operating condition to an OCL condition. If the voltage regulator has multiple phases, the LIMIT signal in each of the phases is monitored for an OCL condition in that phase. For every phase, the state machine monitors whether the LOOP signal is coming first or if the LIMIT signal is coming first. The order of the two signals is determinative of whether that phase is in an OCL condition because the LIMIT signal will come after the LOOP signal when in OCL. In step 630, when it is detected that a particular number of phases, N, of the total number of phases have entered into an OCL condition, the overcurrent limit threshold is dynamically reduced to the system rated current limit, which is 40 A in this example. In at least one example, N is four out of a total of eight phases in the system to trigger the reduction in the overcurrent limit threshold in step 630. The reduction in the overcurrent limit threshold may be done in a single step or in a series of smaller steps.

After the overcurrent limit threshold is reduced (e.g. 40 A), the processor senses that the power converter system is in an OCL condition and will stop requesting more current for the load. After the load demand decreases, each phase of the voltage regulator system will cease to be in an OCL condition and will return to normal operation. In step 640, after all of the phases have cleared the OCL condition, the overcurrent limit threshold is dynamically increased back to the initial value it was given in step 610 (e.g. 45 A).

When the state machine detects that a certain number of phases have entered into OCL, instead of supporting the higher initial overcurrent limit threshold for a sustained period of time, the overcurrent limit threshold is dynamically decreased to the system rated current limit. The voltage regulator system operates at that reduced overcurrent limit threshold for as long as the load demand remains high and an OCL condition persists. After the load demand is reduced and the OCL condition clears, the overcurrent limit threshold is dynamically increased back to the higher initial value where it remains during normal operation. The increase in the overcurrent limit threshold may be done in a single step or in a series of smaller steps.

This provides a first advantage that the voltage undershoot due to the transient load condition will be reduced because the power supply is starting with more current in the beginning for a period of time. This also provides a second advantage that the reliability of the power FETs will be protected because the current through the FETs only remains above its rated operating current for a brief period of time, not long enough to damage the FETs. Therefore, a tradeoff does not have to be made between either having acceptable transient output voltage response or component reliability.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device, or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:
1. A voltage regulator circuit comprising:
 a first comparator having first and second comparator inputs and a first comparator output, wherein the first comparator input is coupled to a waveform input source, and the second comparator input is coupled to an output voltage terminal;
 a second comparator having third and fourth comparator inputs and a second comparator output, wherein the third comparator input is coupled to a voltage source configured to provide a voltage representing a current limit, and the fourth comparator input is coupled to the output voltage terminal; and
 a state machine having first and second state machine inputs and a state machine output, wherein the first state machine input is coupled to the first comparator output, and the second state machine input is coupled to the second comparator output;
 wherein a state of the state machine is determined responsive to the first and second comparator outputs, and the state machine output provides a pulse-width-modulated (PWM) signal responsive to the state of the state machine; and
 wherein the current limit is set to a first value and operating in a first state, then decreasing the current limit to a second value in response to detecting a transition to a second state.

2. The voltage regulator circuit of claim 1, further comprising:
a loop compensation circuit having first and second compensation inputs and a compensation output, wherein the first compensation input is coupled to the output voltage terminal, the second compensation input is coupled to the fourth comparator input, and the compensation output is coupled to the second comparator input.

3. The voltage regulator circuit of claim 2, wherein the loop compensation circuit includes a proportional-integral-derivative (PID) controller.

4. The voltage regulator circuit of claim 1, including a current sense element coupled between the output voltage terminal and the fourth comparator input.

5. The voltage regulator circuit of claim 1, further comprising:
a driver circuit having a driver input and a driver output, wherein the driver input is coupled to the state machine output.

6. The voltage regulator circuit of claim 5, wherein the driver output is coupled to a control terminal of a power transistor.

7. The voltage regulator circuit of claim 5, wherein the driver output has first and second driver output terminals, and the voltage regulator circuit includes:
a first transistor having a first control terminal and first and second current terminals, wherein the first control terminal is coupled to the first driver output terminal, the first current terminal is coupled to an input voltage source, and the second current terminal is coupled to an inductor; and
a second transistor having a second control terminal and third and fourth current terminals, wherein the second control terminal is coupled to the second driver output terminal, the third current terminal is coupled to a ground terminal, and the fourth current terminal is coupled to the inductor.

8. The voltage regulator circuit of claim 1, wherein the second comparator includes a gating input terminal that enables and disables the second comparator output.

9. The voltage regulator circuit of claim 8, wherein the second comparator output is driven to a particular state responsive to a signal at the gating input terminal.

10. A method of improving transient response in a voltage regulator comprising:
setting an overcurrent limit for the voltage regulator to a first value and operating the voltage regulator in a normal operating state, wherein the first value is higher than a continuous current limit value for the voltage regulator;
measuring an output current being provided by the voltage regulator;
detecting whether the voltage regulator has transitioned from the normal operating state to an overcurrent state;
decreasing the overcurrent limit to a second value in response to detecting a transition to the overcurrent state, the second value being equal to the continuous current limit value for the voltage regulator;
reducing a load demand on the voltage regulator to cause the output current to be lower than the second value; and
increasing the overcurrent limit to the first value in response to the voltage regulator transitioning from the overcurrent state to the normal operating state.

11. The method of claim 10, wherein the voltage regulator is a multiphase voltage regulator, and detecting whether the voltage regulator has transitioned from the normal operating state to the overcurrent state includes detecting whether a minimum number of phases have transitioned from the normal operating state to the overcurrent state.

12. The method of claim 10, wherein the voltage regulator includes a state machine that determines whether the voltage regulator is in the normal operating state or the overcurrent state.

13. The method of claim 12, wherein an output of the state machine provides a PWM signal.

14. The method of claim 10, wherein the voltage regulator includes first and second comparators, and respective outputs of the first and second comparators determine whether the voltage regulator is in the overcurrent state.

15. A voltage regulator system comprising:
an inductor coupled to an output voltage terminal;
a current sense circuit having a current sense input and a current sense output, wherein the current sense input is coupled to the inductor;
a first comparator having first and second comparator inputs and a first comparator output, wherein the first comparator input is coupled to a waveform input source, and the second comparator input is coupled to the output voltage terminal;
a second comparator having third and fourth comparator inputs and a second comparator output, wherein the third comparator input is coupled to a voltage source configured to provide a voltage representing a current limit, and the fourth comparator input is coupled to the current sense output;
a state machine having first and second state machine inputs and a state machine output, wherein the first state machine input is coupled to the first comparator output, and the second state machine input is coupled to the second comparator output; and
a driver circuit having a driver input and a driver output, wherein the driver input is coupled to the state machine output;
wherein a state of the state machine is determined responsive to the first and second comparator outputs, and the state machine output provides a pulse-width-modulated (PWM) signal responsive to the state of the state machine; and
wherein the current limit is set to a first value and operating in a first state, then decreasing the current limit to a second value in response to detecting a transition to a second state.

16. The voltage regulator system of claim 15, wherein the driver output has first and second driver output terminals, and the voltage regulator system includes:
a first transistor having a first control terminal and first and second current terminals, wherein the first control terminal is coupled to the first driver output terminal, the first current terminal is coupled to an input voltage source, and the second current terminal is coupled to the inductor; and
a second transistor having a second control terminal and third and fourth current terminals, wherein the second control terminal is coupled to the second driver output terminal, the third current terminal is coupled to a ground terminal, and the fourth current terminal is coupled to the inductor and to the second current terminal.

17. The voltage regulator system of claim 15, further comprising:

a loop compensation circuit having first and second compensation inputs and a compensation output, wherein the first compensation input is coupled to the output voltage terminal, the second compensation input is coupled to the current sense output, and the compensation output is coupled to the second comparator input.

18. The voltage regulator system of claim 17, wherein the loop compensation circuit includes a proportional-integral-derivative (PID) controller.

19. The voltage regulator system of claim 15, wherein the current sense circuit includes a current sense resistor.

20. The voltage regulator system of claim 15, wherein the second comparator includes a gating input terminal that enables and disables the second comparator output.

\* \* \* \* \*